United States Patent
Bansal et al.

(10) Patent No.: US 9,442,140 B2
(45) Date of Patent: Sep. 13, 2016

(54) AVERAGE CURRENT MODE CONTROL OF MULTI-PHASE SWITCHING POWER CONVERTERS

(71) Applicant: QUALCOMM Incorporated, San Diego, CA (US)

(72) Inventors: Mukesh Bansal, San Diego, CA (US); Qadeer A Khan, San Diego, CA (US); Chunlei Shi, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 256 days.

(21) Appl. No.: 14/207,338

(22) Filed: Mar. 12, 2014

(65) Prior Publication Data
US 2015/0263614 A1 Sep. 17, 2015

(51) Int. Cl.
*H02M 3/158* (2006.01)
*G01R 19/25* (2006.01)
*H02M 1/00* (2006.01)

(52) U.S. Cl.
CPC ........ *G01R 19/2506* (2013.01); *H02M 3/1584* (2013.01); *H02M 2001/0009* (2013.01); *H02M 2001/0025* (2013.01)

(58) Field of Classification Search
CPC ............................ H02M 3/156; H02M 3/1584
USPC ................................................. 323/272, 282
See application file for complete search history.

(56) References Cited

U.S. PATENT DOCUMENTS

| 8,008,901 B2 * | 8/2011 | Tang ..................... H02M 3/157 323/222 |
| 8,415,933 B2 | 4/2013 | Loikkanen et al. |
| 2005/0225307 A1 * | 10/2005 | Sato ..................... H02M 3/1584 323/282 |
| 2007/0064456 A1 | 3/2007 | Schuellein |
| 2010/0141230 A1 | 6/2010 | Lukic et al. |
| 2012/0098514 A1 | 4/2012 | Wang et al. |
| 2014/0002037 A1 * | 1/2014 | Babazadeh ........... H02M 3/156 323/271 |
| 2014/0253080 A1 * | 9/2014 | Jiang ........................ G05F 1/62 323/284 |
| 2015/0188406 A1 * | 7/2015 | Nishi .................. H02M 3/1584 323/217 |
| 2015/0263614 A1 * | 9/2015 | Bansal ............... G01R 19/2506 323/282 |

FOREIGN PATENT DOCUMENTS

| DE | 102007025229 A1 | 12/2008 |
| WO | 03017455 A2 | 2/2003 |
| WO | 2010009054 A1 | 1/2010 |

OTHER PUBLICATIONS

Huang Y P., et al., "Single controller current balance (SCCB) technique for voltage-mode multi-phase buck converter", Circuits and Systems (ISCAS), 2011 IEEE International Symposium on, IEEE, May 15, 2011, pp. 761-764, XP031997742, DOI: 10.1109/ISCAS.2011.5937677 ISBN: 978-1-4244-9473-6 the whole document.

(Continued)

*Primary Examiner* — Jeffrey Sterrett
(74) *Attorney, Agent, or Firm* — Arent Fox LLP

(57) ABSTRACT

Exemplary embodiments are related to switching power converters. A switching power converter may comprise a plurality of control unit configured for average current mode control, wherein each control unit of the plurality comprises a dedicated proportional control unit. The switching power converter may further comprise an integrator coupled to each control unit of the plurality of control unit and configured to convey a signal to each control unit.

25 Claims, 9 Drawing Sheets

(56) References Cited

OTHER PUBLICATIONS

International Search Report and Written Opinion—PCT/US2015/018425—ISA/EPO—Jul. 8, 2015.
Zhang X., et al., "A novel VRM control with direct load current feedback", 2004 IEEE Applied Power Electronics Conference and Exposition, APEC 04, IEEE, Anaheim, CA, USA, vol. 1, Feb. 22, 2004, pp. 267-271, XP010704440, ISBN: 978-0-7803-8269-5 the whole document.
Huang W., et al., "A scalable multiphase buck converter with average current share bus," Applied Power Electronics Conference and Exposition 2003, 18th Annual IEEE, vol. 1, Feb. 9-13, 2003, pp. 438-443.
Li R., "Modeling Average-Current-Mode-Controlled multi-phase buck converters," IEEE Power Electronics Specialists Conference (PESC), 2008, pp. 3299-3305.

* cited by examiner

Delay due to PWM comparator and power stage is $t_d$

AVERAGE CURRENT MODE CONTROL OF MULTI-PHASE SWITCHING POWER CONVERTERS

BACKGROUND

1. Field

The present invention relates generally to switching converters. More specifically, the present invention relates to embodiments for average current mode control for multi-phase switching power converters.

2. Background

Power management plays an important role in the current day electronics industry.

Battery powered and handheld devices require power management techniques to extend battery life and improve the performance and operation of the devices. One aspect of power management includes controlling operational voltages. Conventional electronic systems, particularly systems on-chip (SOCs) commonly include various subsystems. The various subsystems may be operated under different operational voltages tailored to specific needs of the subsystems. A voltage regulator, which may also be referred to as a "voltage converter" or a "power converter," may be employed to deliver specified voltages to the various subsystems. Voltage regulators may also be employed to keep the subsystems isolated from one another.

A voltage regulator may comprise a switching voltage converter. Switching voltage converters may convert between a higher input voltage and a lower output voltage using one or more electronic switches in conjunction with energy storage devices (inductors or capacitors) to transfer energy between a higher external DC power supply voltage and a lower integrated circuit voltage. One advantage of a switching voltage regulator compared to a linear voltage regulator is greater efficiency.

A switching converter may be based on voltage mode or current mode control techniques. Conventional fixed frequency current mode control techniques include peak current mode control, valley current mode control, and average current mode control. Peak and valley current mode control may be susceptible to sub-harmonic oscillations and may require external slope compensation in addition to a synchronizing ramp. Therefore, peak and valley current mode control techniques may require more complex circuits and, hence, large silicon area.

Conventional average current mode control architectures inherently have no sub-harmonic problem. The main distinguishing feature with respect to peak and valley current mode control is that conventional average current mode control uses a high gain and wide bandwidth current error amplifier. This may force the average current of a switching converter to follow a load current with very small error. Advantages of conventional average current mode control include no requirement of compensation ramp, large noise margins, excellent voltage and current regulations, and input voltage and output voltage feed forward control. Because of two error amplifiers, one for voltage and another for current, this architecture implementation is complex and compensation of the control loop becomes quite challenging. The challenge further grows when an average mode technique is used to implement multi-phase converters.

A need exists for an enhanced switching power converter. More specifically, a need exists for embodiments related to a simplified switching power converter that has advantages of conventional average current mode architectures and can easily be extended to multi-phase without sacrificing performance.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Figure 1A:
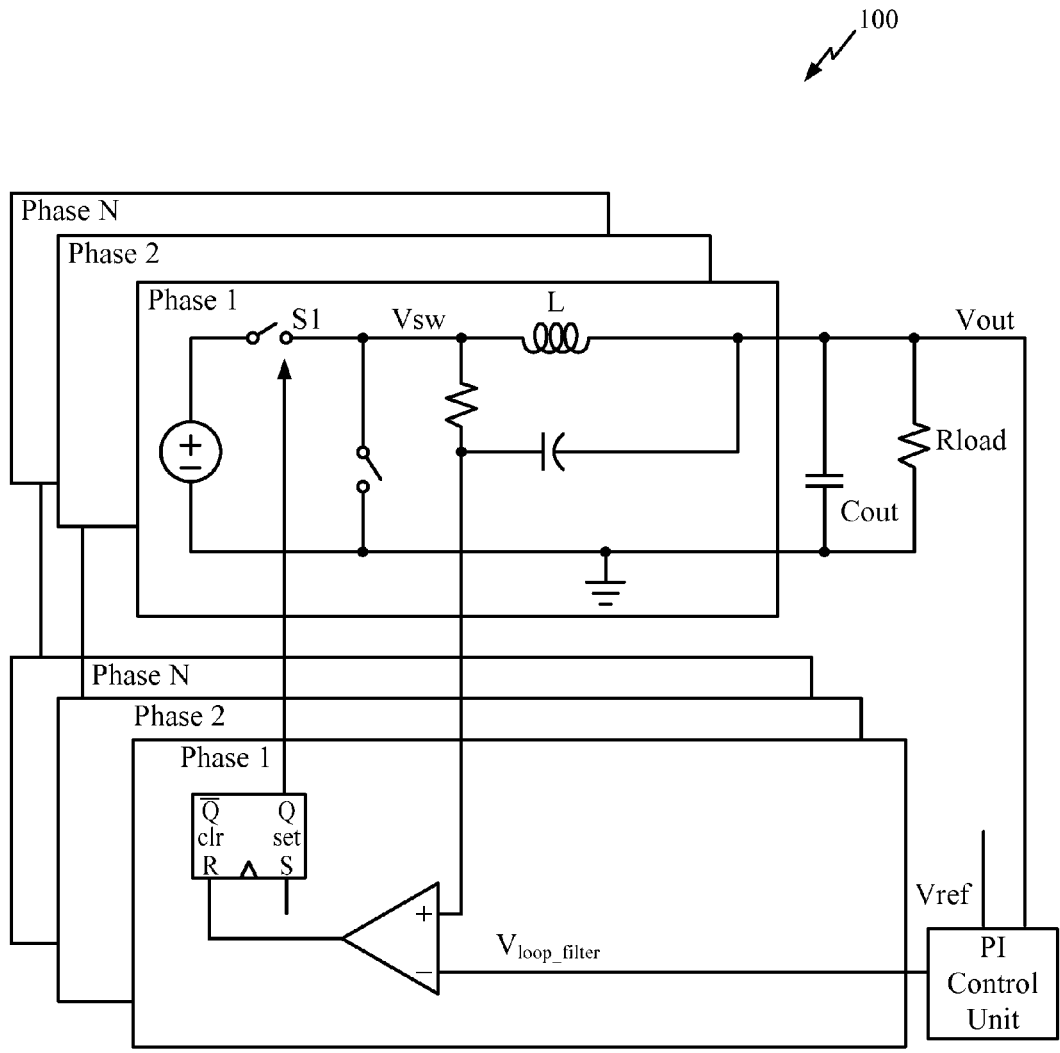
FIGS. 1A and 1B illustrate a multi-phase switching converter configured for peak current mode control.

FIG. 1A illustrates a peak current mode controlled multi-phase switching converter 100 configured to provide output voltage Vout. Peak current mode control technique has been used, hence, the inductor peak current may be fixed in every switching cycle but the minimum inductor current is not bounded. This leads to sub-harmonic oscillations for duty cycle greater than 50%. External slope compensation technique may be required to suppress sub-harmonic oscillations.

Figure 1B:
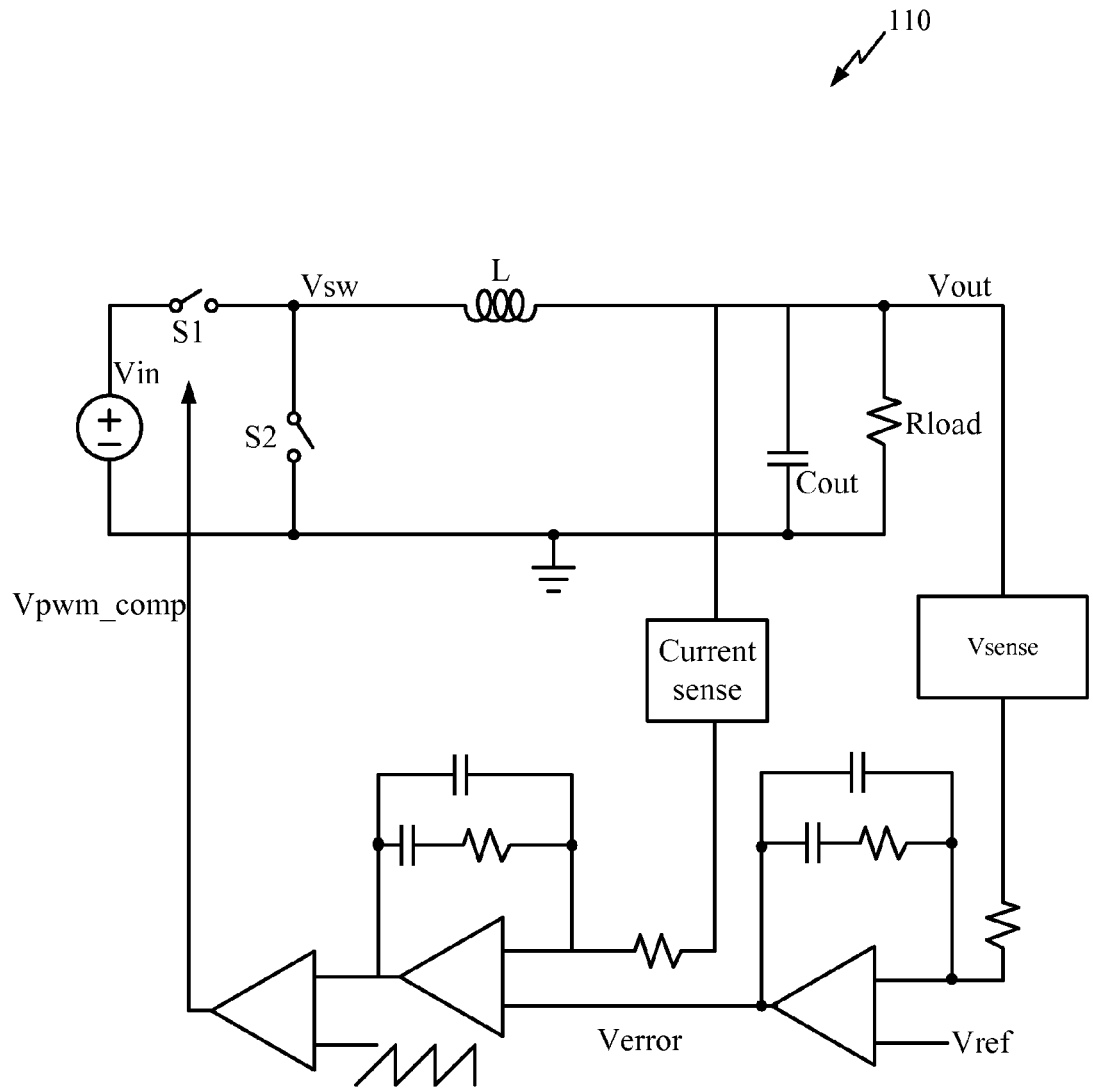

FIG. 1B illustrates a single phase buck converter 110 using conventional average current mode control. As illustrated in FIG. 1B, the control used in converter 110 has two different error integrators along with the compensation circuitry. Hence, the control used may be complex and requires more silicon area to implement.

Exemplary embodiments, as described herein, are directed to fixed frequency switching power converters and methods of operation thereof. Exemplary embodiments may be directed to single-phase or multi-phase power converter configured for using average current mode control techniques. Fixed frequency operation may be achieved by injecting an AC component of an external synchronizing clock. Exemplary embodiments may limit, and possible prevent, sub-harmonic issues. Further, exemplary embodiments may operate from substantially 0-100% duty ratio with relatively fast transient response, relatively fast line/load regulation, and fixed frequency operation.

According to a single phase exemplary embodiment, a switching power converter may comprise a current estimator for estimating a current through an inductor coupled to an output of a power stage configured to convey an output voltage. The power converter may also comprise a control unit configured to compare the estimated inductor current with the resultant of integrated error voltage, a scaled error voltage and an AC component of injected synchronized clock. The resulting pulse width modulated signal controls the power stage.

According to a multi-phase exemplary embodiment, a switching power converter may comprise a plurality of control units configured for average current mode control, wherein each unit of the plurality comprises a dedicated scaled error voltage and may be configured to independently receive an AC component of phase shifted synchronizing clock. Further the switching power converter may comprise a single error voltage integrator shared by all control units. The switching power converter may also comprise a plurality of power stages configured for average current mode control, wherein each power phase of the plurality of power stages has an inductor current estimator and configured to receive a pulse-width modulation signal from an associated control unit of the plurality of control units and convey an output voltage.

Other aspects, as well as features and advantages of various aspects, of the present invention will become apparent to those of skill in the art through consideration of the ensuing description, the accompanying drawings and the appended claims.

Figure 2:
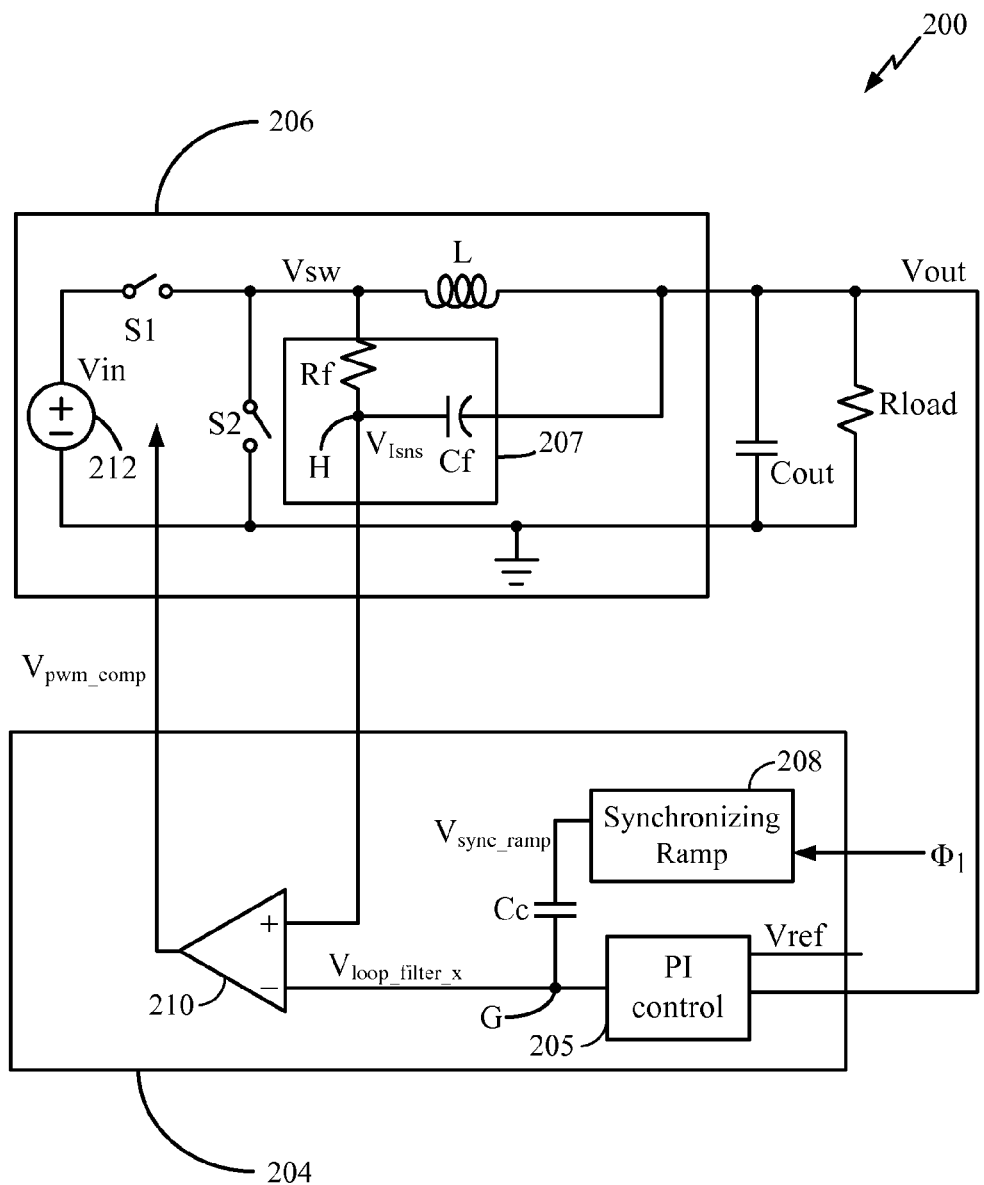
FIG. 2 illustrates a single-phase switching power converter, in accordance with an exemplary embodiment of the present invention.

FIG. 2 depicts a single-phase switching power converter 200, according to another exemplary embodiment of the present invention. Switching power converter 200 comprises a control unit 204 and a power stage 206. Switching power converter 200 further comprises capacitor Cout and resistive load Rload. Switching power converter 200 may be configured to regulate output voltage Vout with a reference voltage Vref. Power stage 206 comprises voltage supply 212, switches S1 and S2, resistor Rf, inductor L, and capacitor Cf. As will be appreciated by a person having ordinary skill in the art, resistor Rf and capacitor Cf may comprise a RC lossless inductor current estimator 207.

Control unit 204 comprises a proportional-integral (PI) control unit 205, a synchronizing ramp 208, a capacitor Cc, and a dual-edge pulse-width modulator comparator 210. PI control unit 205 comprises an input configured to receive output voltage Vout and another input configured to receive reference voltage Vref. An output of PI control unit 205 may be coupled to a node G, which may be a high impedance node. Synchronizing ramp 208 may be configured to receive an external clock phase Φ1. Further, an output of synchronizing ramp 208 may be capacitively coupled to node G (i.e., via capacitor Cc). Hence, an AC component of synchronizing ramp 208, which comprises phase information, may be added to an output of PI control unit 205 at node G via capacitor Cc.

Node G may be further coupled to an input of comparator 210. Another input of comparator 210 may be connected to node H, which may be an output of a lossless RC current estimator 207 of power stage 206. An output of comparator 210, which may comprise a dual edge pulse-width modulated signal, may be conveyed to switches S1 and S2 for controlling operation thereof.

During steady state, PI control unit 205 may compare output voltage Vout with reference voltage Vref and generate an output signal, which may be a combination of an integrated error voltage (Vout−Vref) "an integral component" and a scaled error voltage (Vout−Vref) "a proportional component." Further, an output of synchronizing ramp 208 may capacitively couple an AC component of clock phase Φ1 onto node G. Mathematically, a resultant signal $V_{loop\_filter\_x}$ can be expressed as follows:

$$\text{Vloop\_filter}(t) = \qquad (1)$$
$$Kint * \int_0^t (Vout - Vref) dt + Kp * (Vout - Vref) + \frac{Vramp}{E+C} * (t - nTs)$$

wherein Kint, Kp are the constants, Vramp is the supply of external clock circuit and n is an integer. Resultant signal Vloop_filter_x may be compared with the inductor current $V_{Isns}$ to control the power switches of stage 206 and hence, regulate output voltage Vout.

Lossless RC inductor current estimator 207 may be used to estimate the inductor current. In this embodiment, a slope of the inductor current may be controlled instead of absolute inductor current value. RC inductor current estimator 207 may be designed such that the slope of the output signal ($V_{Isns}$) is greater than the inductor current slope. By limiting the slope of output signal ($V_{Isns}$) of RC inductor current estimator 207, inductor current may be contained within a boundary to ensure stable operation. The output of lossless inductor current estimator 207 will be compared with signal $V_{loop\_filter\_x}$ using pwm comparator 210. Based upon this comparison, a dual-edge pulse-width modulated signal may be generated. This modulated signal may control power switches S1 and S2 of the power stage 206 and regulate output voltage Vout relative to Vref.

During steady state, AC component of the synchronizing clock forces the switching period of converter equal to the synchronizing clock period by virtue of injection locking phenomenon.

Figure 3:
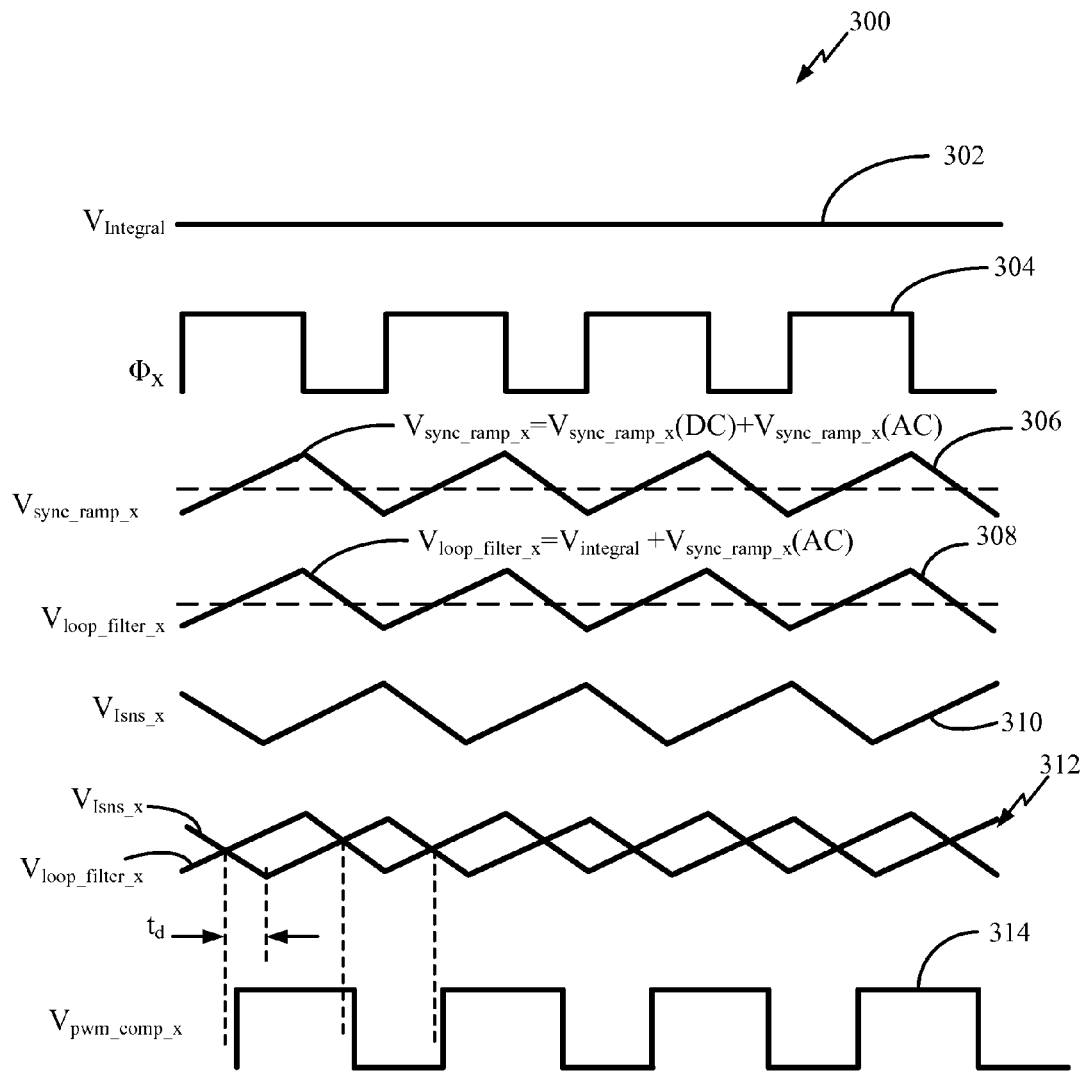
FIG. 3 is a plot illustrating various signals of a single-phase switching power converter, according to an exemplary embodiment of the present invention.

FIG. 3 is a plot 300 including various signals of a device, such as switching power converter 200 illustrated in FIG. 2, during steady state operation. Plot 300 comprises a signal 302, which represents the integral of error signal (error=Vout−Vref). Further, plot 300 comprises signal 304 that represents a synchronizing clock signal (Φ1) of a multi-phase switching power converter and a signal 306 that represents an synchronizing ramp signal (e.g., a signal "$V_{sync\_ramp\_x}$" conveyed by synchronizing ramp 208 of FIG. 2). This synchronizing ramp signal 306 consists of AC phase information and DC of a synchronizing clock. Plot 300 also comprises a signal 308, which represents a signal conveyed to a comparator (e.g., $V_{loop\_filter\_x}$ conveyed to comparator 308). The DC voltage of this signal may be set by signal 302 and the AC phase information is resultant of the summation of injected AC phase information from synchronizing clock signal 304 and output of the proportional control unit. Signal 310, which represents the approximate estimation of inductor current from a power stage (e.g., "$V_{Isns\_x}$"). Plot 300 further comprises signal 308 and signal 310 drawn on top of one another as indicated by reference numeral 312. These two signals will be the input of comparator 210 and will be compared to convey the pulse-width modulated duty cycle signal 314 to the power stage.

Figure 4:
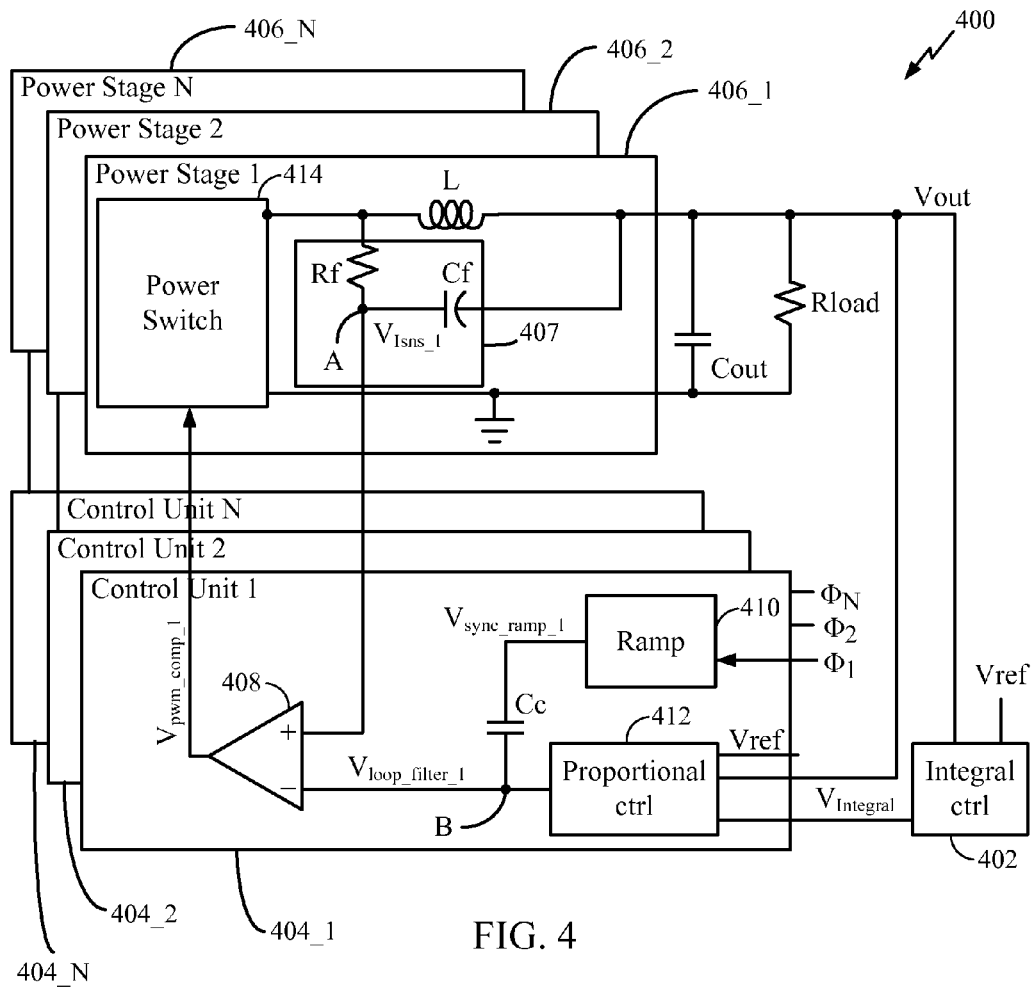
FIG. 4 illustrates a multi-phase switching converter, in accordance with an exemplary embodiment of the present invention.

Because of the fixed frequency operation ensured by injection locking, the proposed technique can be extended for multi-phase power converters. FIG. 4 illustrates a multi-phase switching power converter 400, according to an exemplary embodiment of the present invention. Multi-phase switching power converter 400 comprises an integral control unit 402, a plurality of control units 404_1-404_N, and a plurality of power stages 406_1-406_N. Each unit 404 of the plurality of control units 404_1-404_N comprises a synchronizing ramp 410, a proportional control unit 412, a capacitor Cc, and a comparator 408. Further, each stage 406 of the plurality of power stages 406_1-406_N comprises a power switch 414, an inductor L, and a RC current estimator, which comprises resistor Rf and capacitor Cf. Further, device 400 comprises a capacitor Cout and a resistive load Rload. Device 400 may be configured for conveying an output voltage Vout. It may be noted that the plurality of control units 404_1-404_N and the plurality of power stages 406_1-406_N together may be referred to as a plurality of phases of a multi-phase switching power converter.

As illustrated in FIG. 4, integral control unit 402 may be configured to receive reference voltage Vref and output voltage Vout, and convey an error integral control signal ($V_{integral}$) to proportional control unit 412 of each unit 404. Proportional control unit 412 of each unit 404 is further configured to receive output voltage Vout and reference voltage Vref. Further, synchronizing ramp 410 of each unit 404 may be configured to receive a phase signal $\Phi_1$-$\Phi_N$. The output signal of synchronizing ramp 410 may be connected to the output of the proportional control unit 412 via capacitor Cc. Within each unit 404, comparator 408 may be configured to receive a signal $V_{loop\_filter\_x}$ at node B, which comprises capacitively coupled phase information (i.e., the AC component of a clock phase), proportional and integral of the error voltage. Comparator 408 may be further configured to receive a signal $V_{Isns\_x}$ from a node A of a corresponding stage 406. More specifically, an inverting input of comparator 408 may be configured to receive a signal via node B and a non-inverting input of comparator 408 may be configured to receive a signal from an RC lossless estimator 407 of a corresponding phase 406. An output of comparator 408 of each unit 404, which may comprise a pulse-width modulation signal, may be coupled to power switch 414 of a corresponding power stage 406.

Power converter 400 may be configured to use a single integrator in a loop, therefore, each phase of the power converter 400 has the same DC voltage component at all nodes, but has a different phase shifted AC voltage component. Hence, all nodes having a low impedance path to a DC source or ground can be shared to reduce the circuit and, therefore, die area. However, high impedance nodes might have phase information and, thus, should not be shared.

Various exemplary embodiments related to multi-phase converters, as describe herein, split a PI compensator into a proportional unit and integral unit. Each phase of a multi-phase converter has dedicated proportional control unit but uses a single integrator unit shared by all phases. Because an output node of the integrator unit "$V_{integral}$" may be a low impedance node to ground, it can be shared across phases. However, an output node of proportional unit (i.e., node B) may be a high impedance node and has phase information, thus it should not be shared. Splitting of the PI compensator may avoid any potential stability concern and achieves multi-phase operation with reduced circuitry. Since each phase has a dedicated high impedance proportional unit output node, frequency and phase information can be injected at node B without substantially affecting the low impedance output node of the integrator, and injection locking can be achieved for fixed frequency multi-phase operation.

Figure 5:
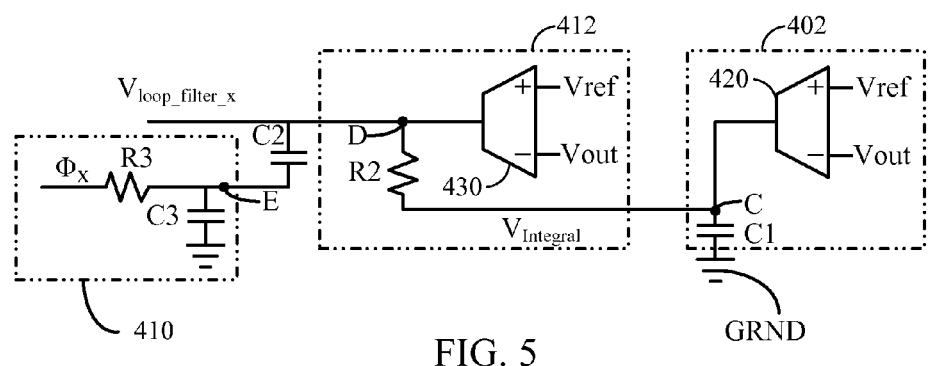
FIG. 5 illustrates an integral control unit, a proportional control unit, and an external ramp of a multi-phase switching converter, according to an exemplary embodiment of the present invention.

FIG. 5 provides a more detailed illustration of integral control unit 402, proportional control unit 412, and synchronizing ramp 410, in accordance with an exemplary embodiment of the present invention. As illustrated in FIG. 5, integral control unit 402 may comprise a trans-conductance amplifier 420 having an input configured to receive reference voltage Vref and another input configured to receive output voltage Vout. Further, an output of trans-conductance amplifier 420 may be coupled to a node C which may be further coupled to a capacitor C1, which may be further coupled to a ground voltage GRND.

Proportional control unit 412 comprises a trans-conductance amplifier 430 having an input configured to receive reference voltage Vref and another input configured to receive output voltage Vout. An output of trans-conductance amplifier 430 may be coupled to a node D which may be further coupled to node C via a high resistance resistor R2. Accordingly, a DC bias voltage at node D may be set by a DC voltage of signal at node C. Further, since node D may be a high impedance node, an AC voltage at node D may be isolated from node C. Synchronizing ramp 410, which may be configured to receive a phase signal $\Phi_x$, comprises a capacitor C3 and a resistor R3. AC voltage information of synchronizing ramp signal at node E may be coupled to node D via a capacitor C2. As will be appreciated by a person having ordinary skill in the art, a signal at node D (i.e., $V_{loop\_filter\_x}$) may comprise a combination of a DC voltage output from integral control unit 402, an AC voltage output from synchronizing ramp 410 and an AC voltage output from proportional control unit 412.

As will be appreciated by a person having ordinary skill in the art, multi-phase switching power converter 400, which may be implemented via an average current mode control technique, comprises a single integrator for a plurality of phases and dedicated proportional control unit per phase. These dedicated proportional control units may have the phase information at their output node. This phase information may be injected at node D via coupling capacitor C2 by the fixed frequency external synchronizing ramp signal. Further, the resultant signal at node D ($V_{loop\_filter\_x}$) may be compared with the estimated inductor current signal at node A ($V_{Isns\_x}$) via comparator 408 of each phase and produce a duty cycle of the corresponding phase. The fixed frequency of this pulse width modulated duty cycle signal may be forced by the injected fixed frequency synchronizing ramp signal (i.e., via a well know technique commonly referred to as "frequency locking"). Output of the comparator 408 of each control unit 404 may be connected to the corresponding power switch 414 of each power stage 406 and produce the desired output voltage.

Figure 6:
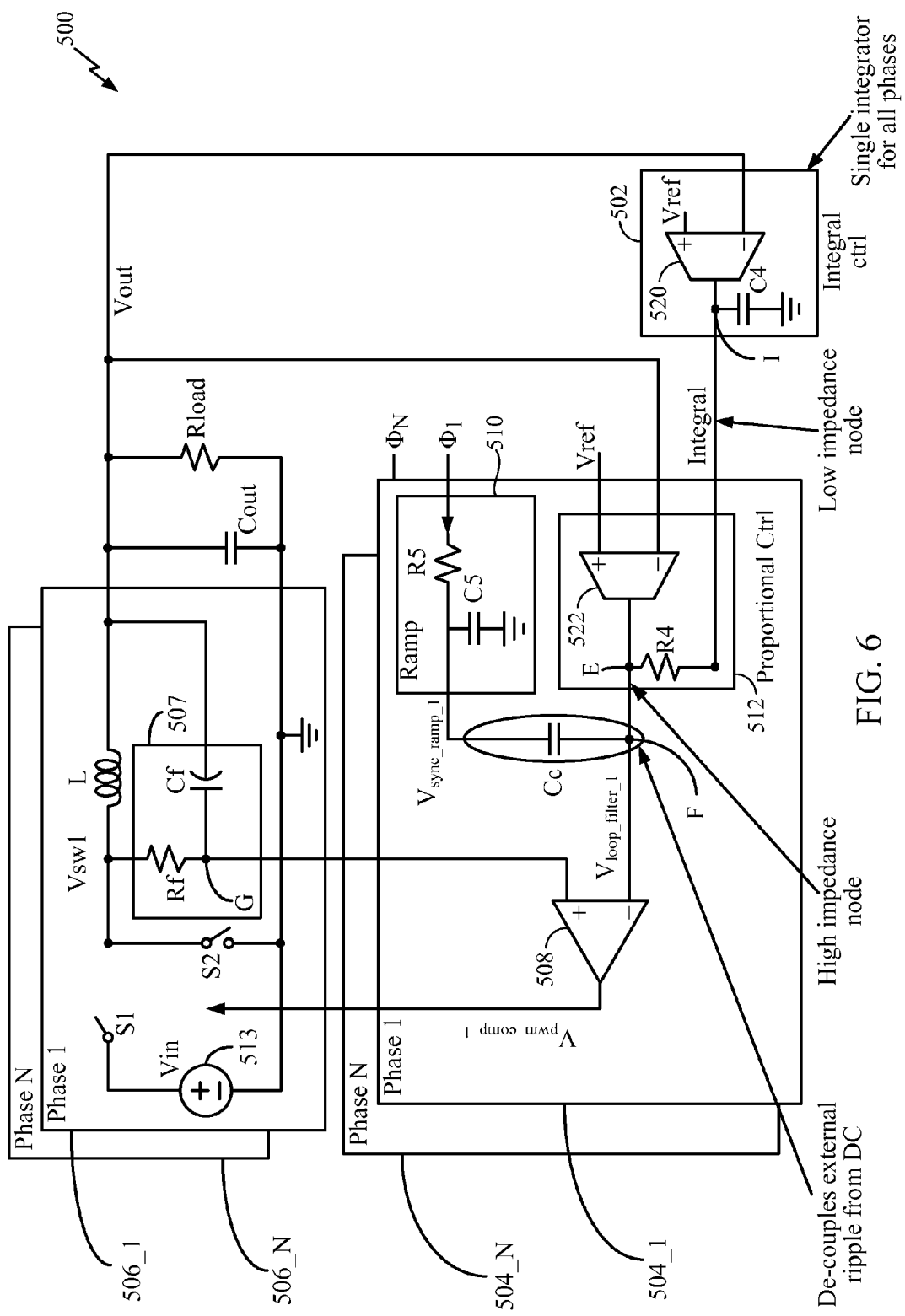
FIG. 6 is an illustration of a multi-phase switching converter, in accordance with an exemplary embodiment of the present invention.

FIG. 6 is another illustration of a multi-phase switching power converter 500, according to an exemplary embodiment of the present invention. Multi-phase switching power converter 500 comprises an integral control unit 502, a plurality of control units 504_1-504_N, and a plurality of power stages 506_1-506_N. Device 500, which may be configured to convey output voltage Vout, further comprises output capacitor Cout and resistive load Rload.

Each unit 504 of the plurality of control units 504_1-504_N comprises a synchronizing ramp 510, a proportional control unit 512, capacitor Cc, and a comparator 508. Further, each stage 506 of the plurality of power stages 506_1-506_N comprises switches S1 and S2, inductor L, and RC current estimator 507, which comprises resistor Rf and capacitor Cf. Integral control unit 502 comprises a trans-conductance amplifier 520 and a capacitor C4. Further, proportional control unit 512 of each unit 504 comprises a trans-conductance amplifier 522 and a resistor R4, and ramp 510 of each unit 504 comprises a resistor R5 and a capacitor C5.

An output of integral control unit 502 may be coupled to a node E of each proportional control unit 512 via resistor R4. Node E may be further coupled to a node F, which may be coupled to an input of comparator 508. Another input of comparator 508 may be coupled to a node G of a corresponding stage 506. In addition, an output of ramp 510 may be coupled to node F via capacitor Cc. An output of comparator 508 of each unit 504 may comprise a pulse-width modulation signal, which may be configured to control switches S1 and S2 of a corresponding stage 506.

During a contemplated operation of multi-phase switching power converter 500, each ramp 510 may be configured to receive a phase signal ("Φ") and convey a signal to node F via capacitor Cc. Further, node F receives an output of proportional control unit 512 and the resultant signal, and a loop filter signal ("$V_{loop\_filter\_1}$") may be conveyed to comparator 508. Comparator 508 may be further configured to receive a signal from current estimator 507, and convey a signal ("$V_{pwm\_comp\_1}$") to an associated stage 506 for controlling switches S1 and S2. Multi-phase switching power converter 500 may be configured to convey output voltage Vout.

As will be understood by a person having ordinary skill in the art, integral and proportional paths of multi-phase switching power converter 500 are de-coupled, thus allowing for different phase information to be added on a proportional node (i.e., node F) for various phases. Further, external phase information may be easily injected at a high impedance node (i.e., node E) without disturbing a low impedance node (i.e., a node I).

Figure 7:
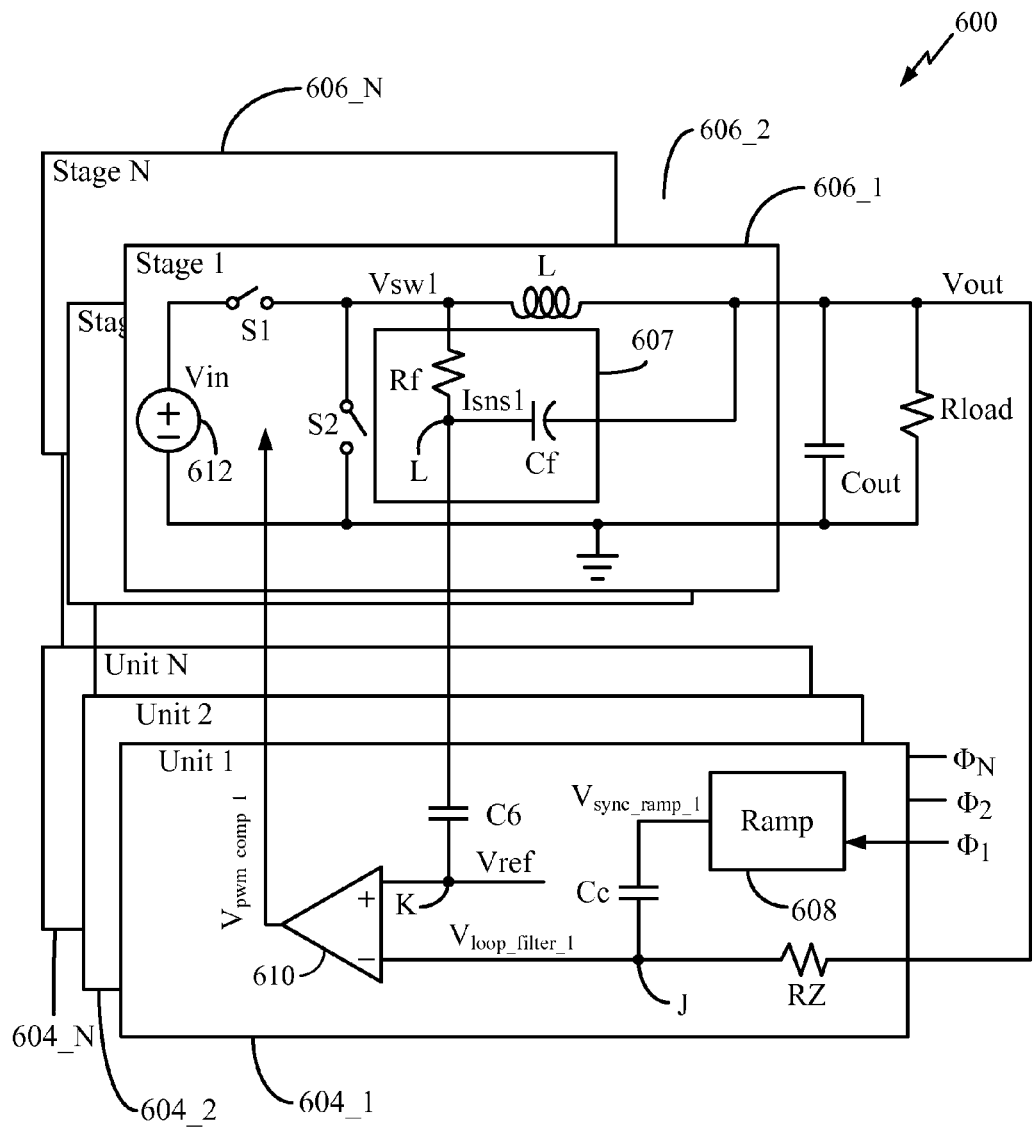
FIG. 7 depicts yet another multi-phase switching converter, according to an exemplary embodiment of the present invention.

FIG. 7 depicts a multi-phase switching power converter 600, in accordance with another exemplary embodiment of the present invention. Multi-phase switching power converter 600 comprises a plurality of control units 604_1-604_N and a plurality of power stages 606_1-606_N. Multi-phase switching power converter 600 further comprises capacitor Cout and resistive load Rload. Multi-phase switching power converter 600 may be configured for conveying an output voltage Vout.

Each control unit 604 comprises a synchronization ramp 608 and a comparator 610. An output of ramp 608 may be coupled to a node J via capacitor Cc. Node J may be further coupled to output voltage Vout via a resistor RZ. Node J may be also coupled to an input of comparator 610. Another input of comparator 610 may be coupled to a node K, which may be coupled to reference voltage Vref and a node L of a corresponding stage 606 via capacitor C6. An output of comparator 610 of each control unit 604, which may comprise a pulse-width modulation signal, may be conveyed to an associated power stage 606 for controlling operation thereof. Each power stage 606 comprises a voltage supply 612, switches S1 and S2, inductor L, and RC current estimator 607, which comprises resistor Rf and capacitor Cf.

During operation of multi-phase switching power converter 600, each external ramp 608 may be configured to receive a phase signal ("Φ") and convey a signal to node J via capacitor Cc. Further, node J receives output voltage Vout via resistor RZ and the resulting loop filter signal ("$V_{loop\_filter\_1}$") may be conveyed to comparator 610. Comparator 610 may be further configured to receive a signal from RC current estimator 607 (i.e., via capacitor C6) of an associated power stage 606 and reference voltage Vref, and convey a signal to an associated power stage 606 for controlling switches S1 and S2. Multi-phase switching power converter 600 may be configured to convey output voltage Vout.

Figure 8:
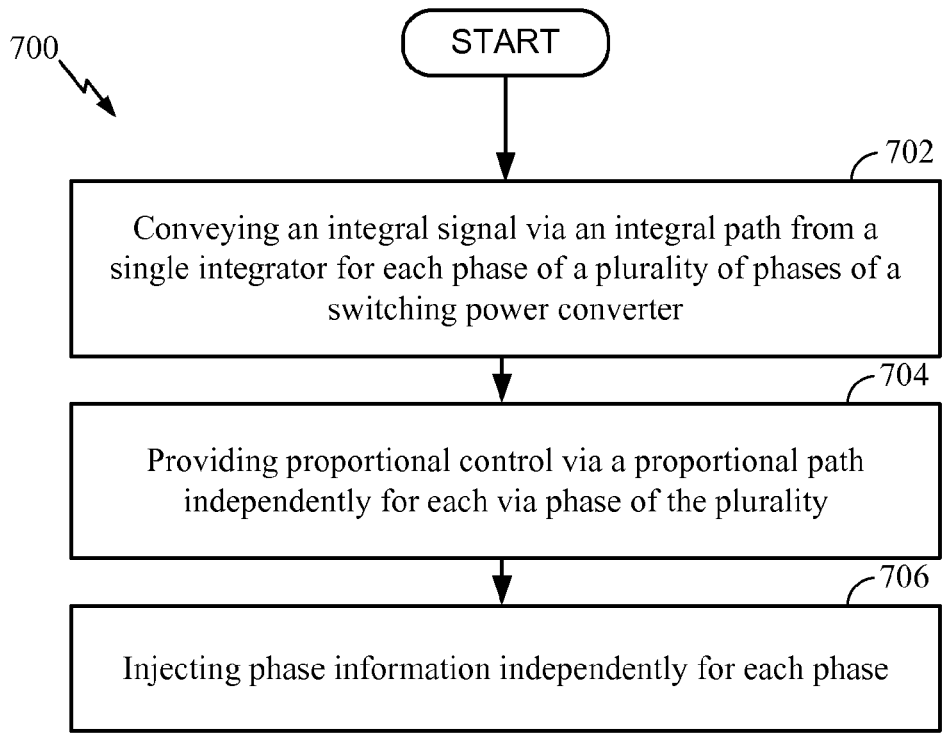
FIG. 8 is a flowchart depicting a method, in accordance with an exemplary embodiment of the present invention.

FIG. 8 is a flowchart illustrating a method 700, in accordance with one or more exemplary embodiments. Method 700 may comprise conveying an integral of error signal via an integral control unit from a single integrator for each phase of a plurality of phases of a switching power converter (depicted by numeral 702). In addition, method 700 may comprise a signal proportional to error voltage via a proportional control unit independent for each phase of the plurality (depicted by numeral 704). Further, method 700 may comprise injecting phase information independently for each phase (depicted by numeral 706).

Figure 9:
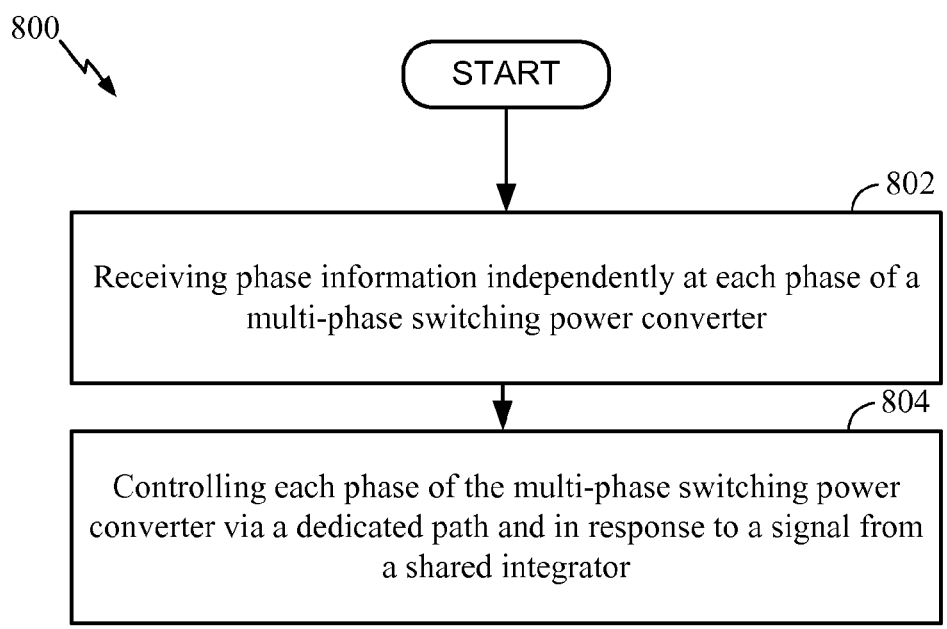
FIG. 9 is a flowchart depicting another method, according to an exemplary embodiment of the present invention.

FIG. 9 is a flowchart illustrating a method 800, in accordance with one or more exemplary embodiments. Method 800 may comprise receiving phase information independently at each phase of a multi-phase switching power converter (depicted by numeral 802). In addition, method 800 may comprise controlling each phase of the multi-phase switching power converter via a dedicated path and in response to a signal from a shared integrator (depicted by numeral 804).

Figure 10:
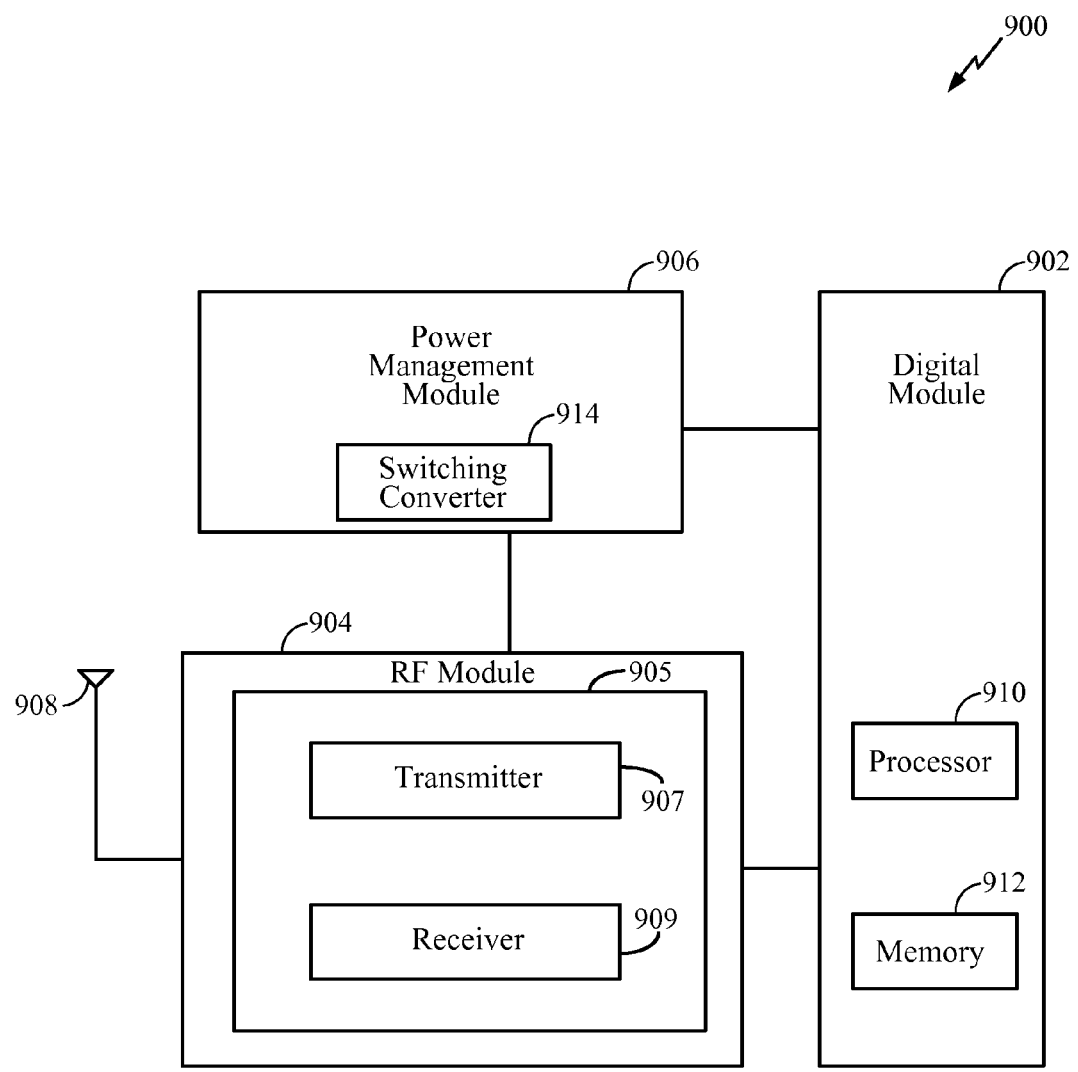
FIG. 10 depicts a device including an RF module, a digital module, and a power management module, in accordance with an exemplary embodiment of the present invention.

FIG. 10 is a block diagram of an electronic device 900, according to an exemplary embodiment of the present invention. According to one example, device 900 may comprise a portable electronic device, such as a mobile telephone. Device 900 may comprise various modules, such as a digital module 902, an RF module 904, and a power management module 906. Digital module 902 may comprise memory and one or more processors 910 and memory 912. RF module 904, which may comprise RF circuitry, may comprise a transceiver 905 including a transmitter 907 and a receiver 909 and may be configured for bi-directional wireless communication via an antenna 908. In general, electronic device 900 may comprise any number of transmitters and any number of receivers for any number of communication systems, any number of frequency bands, and any number of antennas. Further, according to an exemplary embodiment of the present invention, power management module 906 may comprise one or more switching power converters 914, as described herein.

As will be appreciated by a person having ordinary skill in the art, in comparison to conventional switching power converter, the present invention comprises a simplified implementation and limit sub-harmonic oscillations. Further, the present invention may be enable to use envelop tracking techniques, may have an duty ratio operating range of substantially 0% to substantially 100%, exhibits fast line/load transient response, and may be configured for fixed and/or high frequency operation.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media comprises both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are comprised in the definition of medium. Disk and disc, as used herein, comprises compact disc (CD), laser disc, optical disc, digital versatile disc (DVD), floppy disk and blu-ray disc where disks usually reproduce data magnetically, while discs reproduce data optically with lasers. Combinations of the above should also be comprised within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A switching power converter, comprising:
   a plurality of control units configured for average current mode control, each control unit of the plurality comprises a dedicated proportional control unit; and
   an integrator coupled to each control unit of the plurality of control units and configured to convey a signal to each control unit.

2. The switching power converter of claim 1, wherein each control unit further comprises a synchronizing ramp configured to inject phase information to a first node via a capacitor, the first node coupled to an output of the proportional control unit.

3. The switching power converter of claim 2, the synchronizing ramp comprising a RC circuit configured to receive an external fixed frequency clock phase and convey a signal to a high-impedance node via a capacitor.

4. The switching power converter of claim 2, wherein the single integrator is configured to convey an integral signal to the first node via a resistor.

5. The switching power converter of claim 1, wherein the single integrator is configured to convey an integral signal to a first node via a resistor, the first node coupled to an output of the proportional control unit.

6. The switching power converter of claim 1, the proportional control unit comprising a trans-conductance amplifier configured to receive an output voltage of the switching power converter and a reference voltage and convey a signal to a high-impedance node.

7. A device, comprising:
   means for receiving phase information independently at each control unit of a multi-phase switching power converter; and
   means for controlling each control unit of the multi-phase switching power converter via a dedicated path and in response to a signal from a shared integrator.

8. A switching power converter, comprising:
   a plurality of control units, each control unit of the plurality of control units configured to independently receive an AC component of a clock phase;
   a plurality of power stages configured for average current mode control, each power stage of the plurality of power phases configured to receive a pulse-width modulation signal from an associated control unit of the plurality of control unit and convey an output voltage;
   a synchronizing ramp configured to receive the phase information and convey an output to a node via a capacitor;
   a proportional control unit configured to receive an integral signal from a shared integrator, the output voltage, and a reference voltage, and convey a signal to the node; and a comparator configured to receive a signal representing an estimated inductor current from an associated power stage and a signal from the node, and convey a control signal to the associated power stage.

9. The switching power converter of claim 8, the synchronizing ramp including:
   a resistor coupled between an input and an output of the synchronizing ramp; and
   a capacitor coupled between the output and a ground voltage.

10. The switching power converter of claim 8, the proportional control unit including:
    a trans-conductance amplifier having a first input coupled to the reference voltage and a second input coupled to the output voltage, and output coupled to an output of the proportional control unit; and
    a resistor coupled between an output of an integrator and the output of the proportional control unit.

11. A switching power converter, comprising:
    a plurality of control units, each control unit of the plurality of control units configured to independently receive an AC component of a clock phase;
    a plurality of power stages configured for average current mode control, each power stage of the plurality of power phases configured to receive a pulse-width modulation signal from an associated control unit of the plurality of control unit and convey an output voltage; and
    an integrator configured to receive a reference voltage and the output voltage and convey an integral signal to each control unit of the plurality of control units.

12. The switching power converter of claim 11, the integrator comprising:
    a trans-conductance amplifier having a first input coupled to the reference voltage and a second input coupled to the output voltage, and output coupled to an output of the integrator; and
    a capacitor coupled between the output of the integrator and a ground voltage.

13. A switching power converter, comprising:
    a current estimator for estimating a current through an inductor coupled to an output of a power stage configured to convey an output voltage; and
    a comparator configured to:
      receive a first signal including an integral error voltage, a scaled error voltage and an AC component of a clock phase;
      receive a second signal including an estimated current signal from the current estimator; and
      convey a pulse-width modulation signal for controlling the power stage in response to comparing the first signal and the second signal.

14. A method, comprising:
    conveying an integral signal via an integral control unit from a single integrator for each control unit of a plurality of control units of a switching power converter;
    providing proportional control via a proportional control unit independently for each via control unit of the plurality; and
    injecting phase information independently for each control unit.

15. The method of claim 14, the conveying an integral signal comprising:
    receiving an output voltage of the switching power converter and a reference voltage at a trans-conductance amplifier; and
    conveying an output from the trans-conductance amplifier to generate the integral signal.

16. The method of claim 14, the providing proportional control comprising:
    receiving an output voltage of the switching power converter and a reference voltage at a trans-conductance amplifier;
    conveying an output from the trans-conductance amplifier to an output node of a proportional control unit; and
    receiving the integral signal at the output node via a resistor.

17. The method of claim 14, the injecting phase information comprising:
    receiving a phase signal at a synchronizing ramp including a resistor coupled between an input and an output of the synchronizing ramp and a capacitor coupled between the output and a ground voltage; and
    conveying an output signal of the synchronizing ramp to a node via another capacitor.

18. The method of claim 14, further comprising:
    receiving a signal based on the integral signal, the phase information, and the proportional control at a first input of a comparator;
    receiving a reference signal at a second input of the comparator; and
    conveying a pulse-width modulation signal from the comparator.

19. A method, comprising:
    receiving phase information independently at each control unit of a multi-phase switching power converter; and
    controlling each control unit of the multi-phase switching power converter via a dedicated proportional control unit and in response to a signal from a shared integrator.

20. The method of claim 19, further comprising receiving the signal at each control unit of the multi-phase switching power converter via the shared integrator.

21. The method of claim 19, the controlling each control unit comprising:
    receiving an output voltage of the switching power converter and a reference voltage at a trans-conductance amplifier;
    conveying an output from the trans-conductance amplifier to an output node; and receiving the signal from the shared integrator at the output node via a resistor.

22. The method of claim 19, the receiving phase information comprising:
    receiving a phase signal at a synchronizing ramp including a resistor coupled between an input and an output of the synchronizing ramp and a capacitor coupled between the output and a ground voltage; and
    conveying an output signal of the synchronizing ramp to a node via another capacitor.

23. The method of claim 19, further comprising:
    receiving a loop filter signal based on the integral signal, the phase information, and the proportional control at a first input of a comparator;
    receiving a reference signal representing an estimated inductor current at a second input of the comparator; and
    conveying a pulse-width modulation signal from the comparator.

24. The method of claim 23, further comprising adjusting one or more switches in response to the pulse-width modulation signal.

25. A device, comprising:
- means for conveying an integral signal via an integral path from a single integrator for each control unit of a plurality of control units of a switching power converter;
- means for providing proportional control via a proportional path independently for each via control unit of the plurality; and
- means for injecting phase information independently for each control unit.

* * * * *